United States Patent
Park et al.

(10) Patent No.: US 7,868,667 B2
(45) Date of Patent: Jan. 11, 2011

(54) OUTPUT DRIVING DEVICE

(75) Inventors: Chang-Kun Park, Gyeonggi-do (KR);
Yong-Ju Kim, Gyeonggi-do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR);
Ji-Wang Lee, Gyeonggi-do (KR);
Jae-Min Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/411,893

(22) Filed: Mar. 26, 2009

(65) Prior Publication Data

US 2009/0243667 A1  Oct. 1, 2009

(30) Foreign Application Priority Data

Mar. 26, 2008  (KR) .................. 10-2008-0027798
Dec. 26, 2008  (KR) .................. 10-2008-0134937

(51) Int. Cl.
*H03K 3/00* (2006.01)
(52) U.S. Cl. .................. 327/112; 327/175; 327/392; 327/534
(58) Field of Classification Search ......... 327/108–112, 327/172–176, 387–388, 391, 394, 534; 326/24, 326/25, 82–87
See application file for complete search history.

(56) References Cited

U.S. PATENT DOCUMENTS

| | | | | |
|---|---|---|---|---|
| 4,837,460 A | * | 6/1989 | Uchida | 327/382 |
| 5,748,016 A | * | 5/1998 | Kurosawa | 327/108 |
| 6,232,793 B1 | * | 5/2001 | Arimoto et al. | 326/34 |
| 6,362,665 B1 | * | 3/2002 | Davis et al. | 327/108 |
| 6,833,749 B2 | * | 12/2004 | Erstad | 327/534 |
| 7,123,076 B2 | * | 10/2006 | Hatakeyama et al. | 327/534 |

FOREIGN PATENT DOCUMENTS

| | | |
|---|---|---|
| KR | 1020030056403 | 7/2003 |
| KR | 1020060072893 | 6/2006 |

OTHER PUBLICATIONS

Notice of Preliminary Rejection issued from Korean Intellectual Property Office on Jul. 30, 2010, No English Translation.
Notice of Allowance issued from Korean Intellectual Property Office on Oct. 28, 2010.

* cited by examiner

*Primary Examiner*—An T Luu
(74) *Attorney, Agent, or Firm*—IP & T Group LLP

(57) ABSTRACT

An output driving device capable of improving a slew rate is provided. The output driving device includes a push-pull type driving unit configured with a pull-up PMOS transistor and a pull-down NMOS transistor, wherein body biases of the pull-up PMOS transistor and the pull-down NMOS transistor are controlled for control of a slew rate of an output signal of the driving unit.

27 Claims, 7 Drawing Sheets

OUTPUT DRIVING DEVICE

CROSS-REFERENCES TO RELATED APPLICATIONS

The present invention claims priority of Korean patent application numbers 10-2008-0027798 and 10-2008-0134937, filed on Mar. 26, 2008, and Dec. 26, 2008, respectively, disclosures of which are incorporated herein by reference in their entireties.

BACKGROUND OF THE INVENTION

The present invention relates to an output driving device used in a semiconductor memory device, and more particularly, to an output driving device which is capable of improving a slew rate.

Push-pull type drivers are widely used in buffers and driving amplifiers of semiconductor memory devices. In the push-pull type drivers, the control of the slew rate is very important.

A slew rate is defined as a maximum change rate of an output voltage per unit time. For example, in the case of an output driving device with a gain of 1, an input voltage immediately rises from 0 V to 1 V in an ideal circuit. However, in a practical circuit, when a slew rate is K, an output voltage does not rise simultaneously in response to an input voltage, but rises up to 1 V along a slope function with a slope of K. Therefore, controlling a slew rate of the output driving circuit to comply with a product specification is very important.

FIG. 1 is a circuit diagram of an output driving device of a typical semiconductor memory device.

Referring to FIG. 1, the output driving device includes a pull-up PMOS transistor 101UP and a pull-down NMOS transistor 101DN.

In the output driving device, a signal inputted through an input line 102 is inverted by the push-pull driving circuit, implemented with the pull-up PMOS transistor 101UP and the pull-down NMOS transistor 101DN, and outputted through an output line 103.

FIGS. 2 and 3 are waveform diagrams illustrating an output signal of the output driving device shown in FIG. 1.

FIG. 2 is a voltage waveform illustrating a voltage level of the output signal outputted at the output line 103 when the signal inputted through the input line 102 changes from a high state to a low state, where the output signal changes from a low state to a high state as the output signal corresponds to the inverted input signal. In this case, if the size of the PMOS transistor 101UP is increased, the signal outputted through the output line 103 rapidly changes from the low state to the high state.

FIG. 3 is a voltage waveform illustrating the output signal outputted at the output line 103 when the signal inputted through the input line 102 changes from a high state to a low state, where the output signal changes from a low state to a high state as the output signal corresponds to the inverted input signal. In this case, if the size of the NMOS transistor 101DN is increased, the signal outputted through the output line 103 rapidly changes from the low state to the high state.

As shown above, the slew rate is increased as the sizes of the pull-up PMOS transistor 101UP and the pull-down NMOS transistor 101DN are increased.

FIG. 4 is a structural diagram of an output driving device for controlling a slew rate.

Referring to FIG. 4, the output driving device includes a pull-up driving unit 401UP and a pull-down driving unit 401DN. The pull-up driving unit 401UP and the pull-down driving unit 401DN include a plurality of transistors for the slew rate control.

Specifically, the pull-up driving unit 401UP includes an upper PMOS transistor group provided between a power supply voltage terminal VDD and an output line 403 to receive signals PCODE<0> and PCODE<1> as input signals, and a lower PMOS transistor group configured to receive a signal through an input line 402.

The upper PMOS transistor group includes a plurality of PMOS transistors, whose sources are connected to the power supply voltage terminal VDD, receiving the signals PCODE<0> and PCODE<1> through their gates. The number of the PMOS transistors included in the upper PMOS transistor group is determined by the number of the PCODE signals. The lower PMOS transistor group includes a plurality of PMOS transistors having sources connected to drains of the PMOS transistors in the upper PMOS transistor group, drains connected to the output line 403, and gates receiving the signal inputted through the input line 402. The pull-up driving unit 401UP further includes a PMOS transistor having a source connected to the power supply voltage terminal VDD, a drain connected to the output line 403, and a gate connected to the input line 402.

By including the plurality of the PMOS transistors, the pull-up driving unit 401UP is possible to obtain an effect equivalent to controlling the size of the pull-up transistor 101UP illustrated in FIG. 1.

Likewise, the pull-down driving unit 401DN is implemented with a plurality of NMOS transistors.

That is, the pull-down driving unit 401DN includes a lower NMOS transistor group provided between a ground voltage terminal VSS and the output line 403 to receive signals NCODE<0> and NCODE<1> as input signals, and an upper NMOS transistor group configured to receive a signal through an input line 402.

The upper NMOS transistor group includes a plurality of NMOS transistors having drains connected to the output line 403 and gates receiving the signal inputted through the input line 402. The lower NMOS transistor group includes a plurality of NMOS transistors, whose drains are connected to sources of the NMOS transistors in the upper NMOS transistor group and sources are connected to the ground voltage terminal VSS, receiving the signals NCODE<0> and NCODE<1> through their gates. The number of the NMOS transistors included in the lower NMOS transistor group is determined by the number of the NCODE signals.

The pull-down driving unit 401DN further includes an NMOS transistor having a drain connected to the output line 403, a source connected to the ground voltage terminal VSS, and a gate connected to the input line 402.

By including the plurality of the NMOS transistors, the pull-down driving unit 401DN is possible to obtain an effect equivalent to controlling the size of the pull-down transistor 101DN illustrated in FIG. 1 by using the signals PCODE<0> and PCODE<1>.

Therefore, the output driving device shown in FIG. 4 is configured to obtain the effect equivalent to controlling the sizes of the pull-up PMOS transistor 101UP and the pull-down NMOS transistor 101DN illustrated in FIG. 1.

That is, the pull-up driving unit 401UP operates the PMOS transistors included in the upper PMOS transistor group in response to the signals PCODE for controlling the slew rate according to the specification of the product. Also, the PMOS transistor in the lower PMOS transistor group are operated in response to the signal inputted through the input line 402 to output an output signal through the output line 403. Furthermore, the pull-down driving unit 401DN operates the NMOS transistors in the lower NMOS transistor group in response to the signals NCODE for controlling the slew rate according to the specification of the product. Also, the NMOS transistors in the upper NMOS transistor group are operated in response to the signal inputted through the input line 402 to output the output signal through the output line 403.

However, the driving power of the output driving device shown in FIG. 4 is inefficient because the driving power is set based upon the largest transistor in order to drive the PMOS transistors and the NMOS transistors having various sizes, which constitute the output driving device. Consequently, the conventional output driving device has the above limitation since the slew rate is controlled by using the size of the transistors.

SUMMARY OF THE INVENTION

Embodiments of the present invention are directed to provide an output driving device which is capable of controlling a slew rate of an output signal by controlling body biases of transistors included therein.

In accordance with an aspect of the present invention, there is provided an output driving device including a push-pull type driving unit configured with a pull-up PMOS transistor and a pull-down NMOS transistor, wherein body biases of the pull-up PMOS transistor and the pull-down NMOS transistor are controlled for control of a slew rate of an output signal of the driving unit. The output driving device may further include a first body bias controller configured to control the body bias of the pull-up PMOS transistor, wherein the control of the slew rate is performed by the first body bias controller when an output signal changes from a low state to a high state. The output driving device may further include a second body bias controller configured to control the body bias of the pull-down NMOS transistor, wherein the control of the slew rate is performed by the second body bias controller when an output signal changes from a high state to a low state.

According to another embodiment of the present invention, there is provided a method for driving an output signal, the method comprising driving the output signal at an output node with a push-pull type driving unit with a pull-up PMOS transistor and a pull-down NMOS transistor coupled to the output node, and controlling body bias voltages of the pull-up PMOS transistor and the pull-down NMOS transistor to adjust a slew rate of the output signal. The control of the body biases includes using a first voltage divider to divide a voltage between a power supply voltage terminal and the output node to provide the body bias voltage of the pull-up PMOS transistor, wherein the first voltage divider includes a first control transistor receiving a first control signal and a resistor connected in series, and using a second voltage divider to divide a voltage between the output node and a ground voltage terminal to provide the body bias voltage of the pull-down NMOS transistor, where the second voltage divider includes a second control transistor receiving a second control signal and a resistor connected in series.

In accordance with still another aspect of the present invention, there is provided an output driving device including a push-pull type driving unit configured with a pull-up PMOS transistor and a pull-down NMOS transistor; and a body bias control unit configured to control a slew rate of an output signal of the output driving unit by controlling body biases of the pull-up PMOS transistor and a pull-down NMOS transistor.

DESCRIPTION OF SPECIFIC EMBODIMENTS

Other objects and advantages of the present invention can be understood by the following description, and become apparent with reference to the embodiments of the present invention.

Hereinafter, an output driving device in accordance with an embodiment of the present invention will be described in detail.

Figure 5:
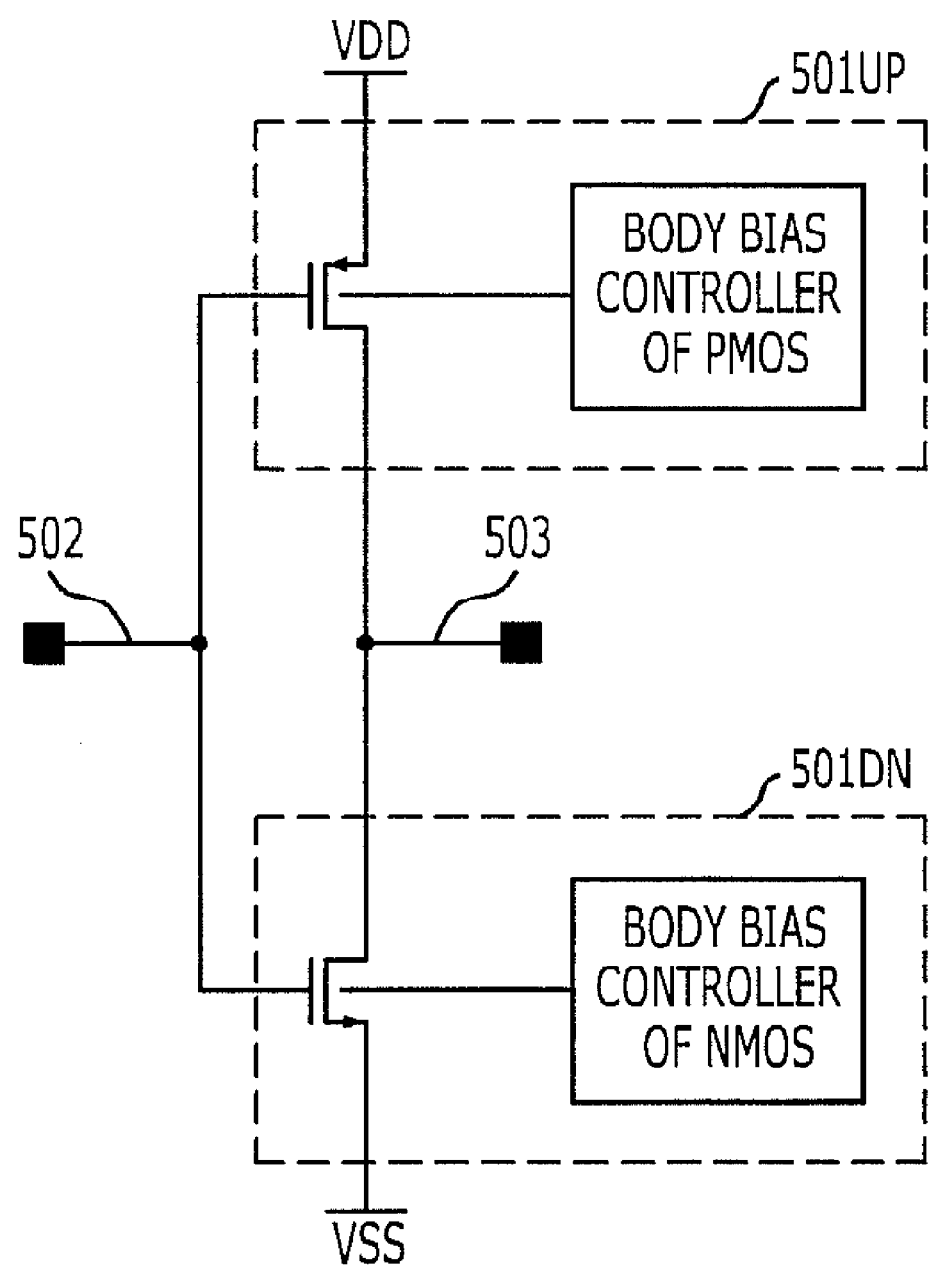
FIG. 5 is a structural diagram of an output driving device for controlling a slew rate in accordance with an embodiment of the present invention.

FIG. 5 is a structural diagram of an output driving device in accordance with an embodiment of the present invention.

Referring to FIG. 5, the output driving device in accordance with the embodiment of the present invention includes a pull-up driving unit 501UP and a pull-down driving unit 501DN, which are provided between an input line 502 and an output line 503.

The pull-up driving unit 501UP includes a PMOS transistor and a first body bias controller. The PMOS transistor has a source connected to a power supply voltage terminal VDD, a drain connected to the output line 503, and a gate connected to the input line 502. The first body bias controller is configured to control a body bias of the PMOS transistor.

The pull-down driving unit 501DN includes an NMOS transistor and a second body bias controller. The NMOS transistor has a source connected to a ground voltage terminal VSS, a drain connected to the output line 503, and a gate connected to the input line 502. The second body bias controller is configured to control a body bias of the NMOS transistor.

The operation of the output driving device shown in FIG. 5 will be described below.

When the signal outputted through the output line 503 changes from a high state to a low state, the second body bias controller included in the pull-down driving unit 501DN increases the body bias of the NMOS transistor for increasing a slew rate. Due to this operation, a threshold voltage of the NMOS transistor is decreased and a current flowing through the NMOS transistor is increased, thereby bringing about the similar effect that the size of the NMOS transistor is increased.

Furthermore, when the signal outputted through the output line 503 changes from a low state to a high state, the first body bias controller included in the pull-up driving unit 501UP decreases the body bias of the PMOS transistor for increasing the slew rate. Due to this operation, a threshold voltage of the PMOS transistor is decreased and a current flowing through the PMOS transistor is increased, thereby obtaining the similar effect that the size of the PMOS transistor is increased.

Figure 6:
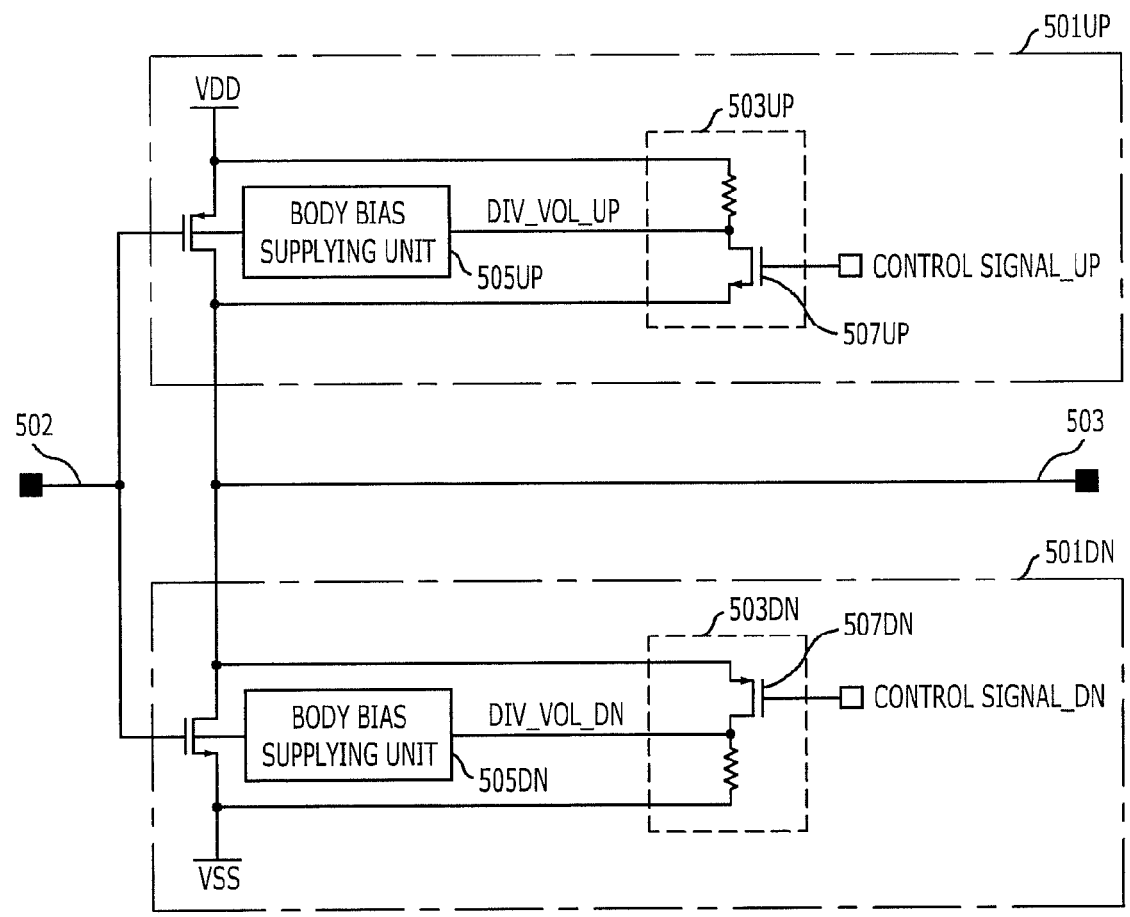
FIG. 6 is a detailed circuit diagram of the output driving device shown in FIG. 5.

FIG. 6 is a detailed circuit diagram of the output driving device shown in FIG. 5.

Referring to FIG. 6, the body bias controller for controlling the slew rate of the output driving device is implemented with a resistor and a MOS transistor.

That is, the first body bias controller of the pull-up driving unit 501UP includes a division voltage generating unit 503UP and a body bias supplying unit 505UP. The division voltage generating unit 503UP is configured to generate a division voltage DIV_VOL_UP by dividing a voltage level between the power supply voltage terminal VDD and the output line 503 at a ratio corresponding to a voltage level of a control signal CONTROL_SIGNAL_UP. The body bias supplying unit 505UP is configured to supply the division voltage DIV_VOL_UP as the body bias of the pull-up PMOS transistor.

The division voltage generating unit 503UP includes a resistor and an NMOS transistor 507UP connected in series between the power supply voltage terminal VDD and the output line 103. The division voltage DIV_VOL_UP is outputted at a connection node between the resistor and a drain of the NMOS transistor 507UP.

The division voltage DIV_VOL_UP is connected to a body of the pull-up PMOS transistor by the body bias supplying unit 505UP so that it is supplied as the body bias voltage of the pull-up PMOS transistor.

In this case, the NMOS transistor 507UP has a gate receiving the control signal CONTROL_SIGNAL_UP, a source connected to the output line 503, and a drain connected to the power supply voltage terminal VDD.

The body bias controller of the pull-down driving unit 501DN includes a division voltage generating unit 503DN and a body bias supplying unit 505DN. The division voltage generating unit 503DN is configured to generate a division voltage DIV_VOL_DN by dividing a voltage level between the output line 503 and the ground voltage terminal VSS at a ratio corresponding to a voltage level of a control signal CONTROL_SIGNAL_DN. The body bias supplying unit 505DN is configured to supply the division voltage DIV_VOL_DN as the body bias of the pull-down NMOS transistor.

The division voltage generating unit 503DN includes a resistor and a PMOS transistor 507DN connected in series between the output line 503 and the ground voltage terminal VDD. The division voltage DIV_VOL_DN is outputted at a connection node between a drain of the PMOS transistor 507DN and the resistor.

The division voltage DIV_VOL_DN is connected to a body of the pull-down NMOS transistor by the body bias supplying unit 505DN so that it is supplied as the body bias voltage of the pull-down NMOS transistor.

In this case, the PMOS transistor 507DN has a gate receiving the control signal CONTROL_SIGNAL_DN, a source connected to the output line 503, and a drain connected to the ground voltage terminal VSS.

Figure 7:
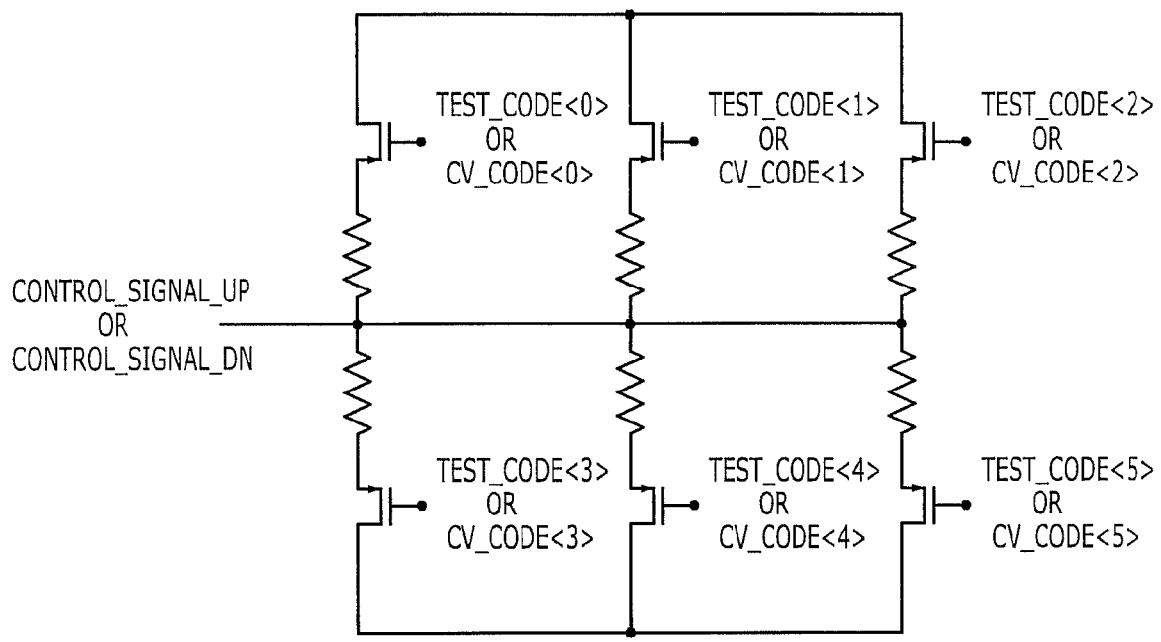
FIG. 7 is a detailed circuit diagram illustrating a circuit for generating control signals inputted to a pull-up driving unit and a pull-down driving unit in the output driving device in accordance with the embodiment of the present invention.

FIG. 7 is a detailed circuit diagram illustrating a circuit for generating the control signals inputted to the pull-up driving unit and the pull-down driving unit in the output driving device shown in FIG. 6.

Referring to FIG. 7, the circuit for generating the control signals CONTROL_SIGNAL_UP and CONTROL_SIGNAL_DN inputted to the first and second body bias controllers in the output driving device of FIG. 6 controls the voltage levels of the control signals CONTROL_SIGNAL_UP and CONTROL_SIGNAL_DN in response to a multi-bit test code TEST_CODE<0:5> externally applied through a predefined pad in a test mode operation, and controls the voltage levels of the control signals CONTROL_SIGNAL_UP and CONTROL_SIGNAL_DN in response to a multi-bit voltage level control code CV_CODE<0:5> defined in a mode register set (MRS) in a normal mode operation.

Specifically, the circuit for generating the control signals CONTROL_SIGNAL_UP and CONTROL_SIGNAL_DN inputted to the first and second body bias controllers increase the voltage levels of the control signals CONTROL_SIGNAL_UP and CONTROL_SIGNAL_DN when the magnitude of the current provided at the power supply voltage terminal VDD becomes greater than the magnitude of the current flowing through the ground voltage terminal VSS as the value of the test code TEST_CODE<0:5> or the voltage level control code CV_CODE<0:5> becomes larger. On the other hand, the circuit for generating the control signals CONTROL_SIGNAL_UP and CONTROL_SIGNAL_DN decreases the voltage levels of the control signals CONTROL_SIGNAL_UP and CONTROL_SIGNAL_DN when the magnitude of the current provided at the power supply voltage terminal VDD becomes greater than the magnitude of the current flowing through the ground voltage terminal VSS as the value of the test code TEST_CODE<0:5> or the voltage level control code CV_CODE<0:5> becomes smaller.

The control of the slew rate in the output driving device in accordance with the embodiment of the present invention having the above structure will be described below.

When the signal outputted through the output line 503 changes from a high state to a low state, the body bias of the NMOS transistor included in the pull-down driving unit 501DN is increased if the slew rate needs to be increased. This is because a threshold voltage of the NMOS transistor is decreased if the body bias (bulk voltage) is increased, that is, if the voltage level of the division voltage DIV_VOL_DN generated from the division voltage generating unit 503DN of the pull-down driving unit 501DN is increased.

In this case, the voltage level of the division voltage DIV_VOL_DN is changed according to how much the PMOS transistor 507DN of the division voltage generating unit 403DN of the pull-down driving unit 501DN is turned on.

That is, if the voltage level of the control signal CONTROL_SIGNAL_DN applied to the gate of the PMOS transistor 507DN is relatively increased, the magnitude of the current flowing from the output line 503 connected to the source of the PMOS transistor 507DN to the body of the pull-down NMOS transistor connected to the drain of the PMOS transistor 507DN becomes relatively small. Thus, the voltage level of the division voltage DIV_VOL_DN is relatively reduced.

On the other hand, if the voltage level of the control signal CONTROL_SIGNAL_DN applied to the gate of the PMOS transistor 507DN is relatively decreased, the magnitude of the current flowing from the output line 503 connected to the source of the PMOS transistor 507DN to the body of the pull-down NMOS transistor connected to the drain of the PMOS transistor 507DN becomes relatively large. Thus, the voltage level of the division voltage DIV_VOL_DN is relatively increased.

Accordingly, when the signal outputted through the output line 503 changes from a high state to a low state, the voltage level of the control signal CONTROL_SIGNAL_DN is relatively decreased if the slew rate needs to be increased. In this case, the PMOS transistor 507DN is turned on relatively harder. Thus, the body bias of the NMOS transistor is increased so that the threshold voltage of the pull-down NMOS transistor is reduced. This means that the magnitude of the current flowing through the pull-down NMOS transistor is increased. Therefore, the size of the pull-down NMOS transistor is effectively increased, and the slew rate can be increased when the signal outputted through the output line 503 changes from a high state to a low state.

On the other hand, when the signal outputted through the output line 503 changes from a high state to a low state, the voltage level of the control signal CONTROL_SIGNAL_DN is relatively increased if the slew rate needs to be decreased. In this case, the PMOS transistor 507DN is turned on relatively less. Thus, the body bias of the NMOS transistor is decreased so that the threshold voltage of the pull-down NMOS transistor is increased. This means that the magnitude of the current flowing through the pull-down NMOS transistor is decreased. Therefore, the size of the pull-down NMOS transistor is effectively decreased, and the slew rate can be decreased when the signal outputted through the output line 503 changes from a high state to a low state.

When the signal outputted through the output line 503 changes from a low state to a high state, the body bias of the pull-up PMOS transistor included in the pull-up driving unit 501UP is increased if the slew rate needs to be increased. This is because a threshold voltage of the pull-up PMOS transistor is decreased if the body bias (bulk voltage) is decreased, that is, if the voltage level of the division voltage DIV_VOL_UP generated from the division voltage generating unit 503UP of the pull-up driving unit 501UP is decreased.

In this case, the voltage level of the division voltage DIV_VOL_UP is changed according to how much the NMOS transistor 507UP of the division voltage generating unit 503UP of the pull-up driving unit 501UP is turned on.

That is, if the voltage level of the control signal CONTROL_SIGNAL_UP applied to the gate of the NMOS transistor 507UP is relatively decreased, the magnitude of the current flowing from the body of the pull-down NMOS transistor connected to the drain of the NMOS transistor 507UP to the output line 503 connected to the source of the NMOS transistor 507UP becomes relatively small. Thus, the voltage level of the division voltage DIV_VOL_UP is relatively increased.

On the other hand, if the voltage level of the control signal CONTROL_SIGNAL_UP applied to the gate of the NMOS transistor 507UP is relatively increased, the magnitude of the current flowing from the body of the pull-down NMOS transistor connected to the drain of the NMOS transistor 507UP to the output line 503 connected to the source of the NMOS transistor 507UP becomes relatively large. Thus, the voltage level of the division voltage DIV_VOL_UP is relatively reduced.

Accordingly, when the signal outputted through the output line 503 changes from a low state to a high state, the voltage level of the control signal CONTROL_SIGNAL_UP is relatively increased if the slew rate needs to be increased. In this case, the NMOS transistor 507UP is turned on relatively harder. Thus, the body bias of the pull-up PMOS transistor is decreased so that the threshold voltage of the pull-up PMOS transistor is reduced. This means that the magnitude of the current flowing through the pull-up PMOS transistor is increased. Therefore, the size of the pull-up PMOS transistor is effectively increased, and the slew rate can be increased when the signal outputted through the output line 503 changes from a low state to a high state.

On the other hand, when the signal outputted through the output line 503 changes from a low state to a high state, the voltage level of the control signal CONTROL_SIGNAL_UP is relatively decreased if the slew rate needs to be decreased. In this case, the NMOS transistor 507UP is turned on relatively less. Thus, the body bias of the pull-up PMOS transistor is increased so that the threshold voltage of the pull-up PMOS transistor is increased. This means that the magnitude of the current flowing through the pull-up PMOS transistor is decreased. Therefore, the size of the pull-up PMOS transistor is effectively decreased, and the slew rate can be decreased when the signal outputted through the output line 503 changes from a low state to a high state.

Figure 1:
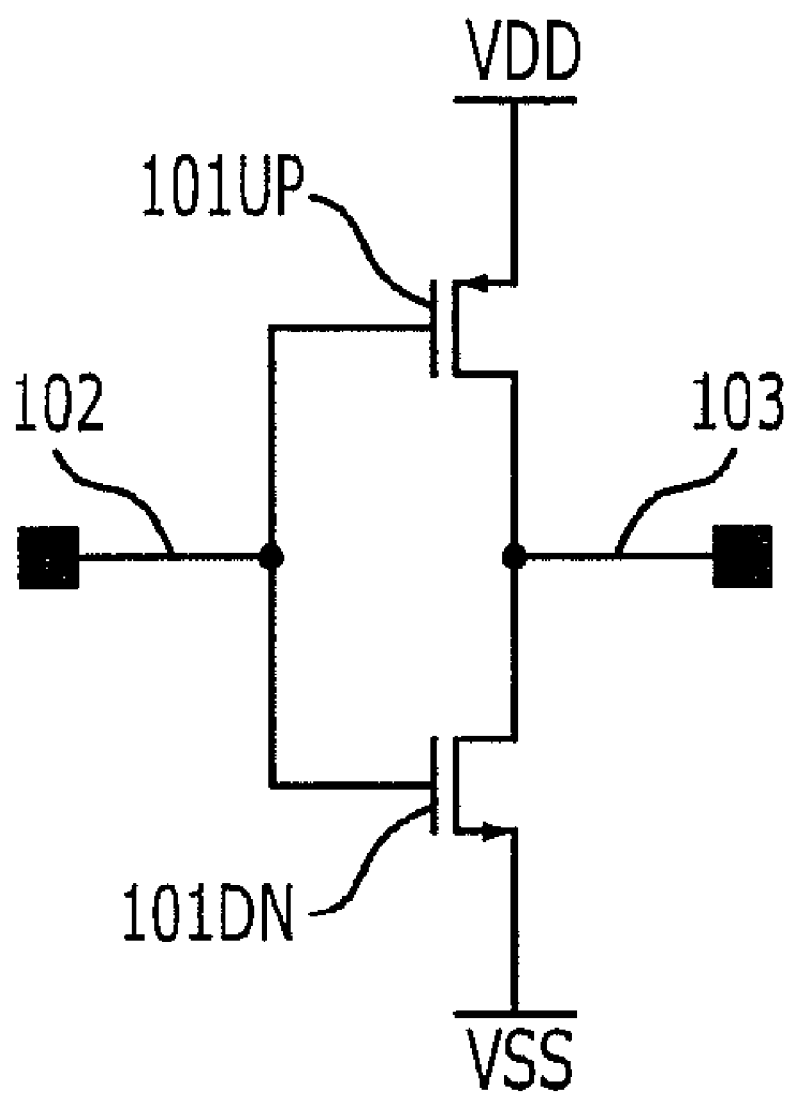
FIG. 1 is a circuit diagram of an output driving device of a typical semiconductor memory device.
Figure 2:
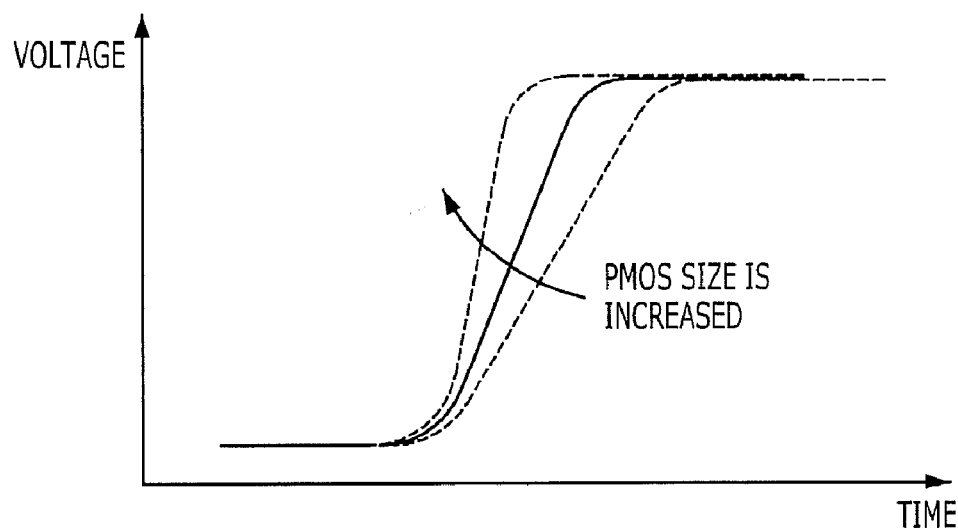
FIGS. 2 and 3 are waveform diagrams illustrating an output signal of the output driving device shown in FIG. 1.
Figure 3:
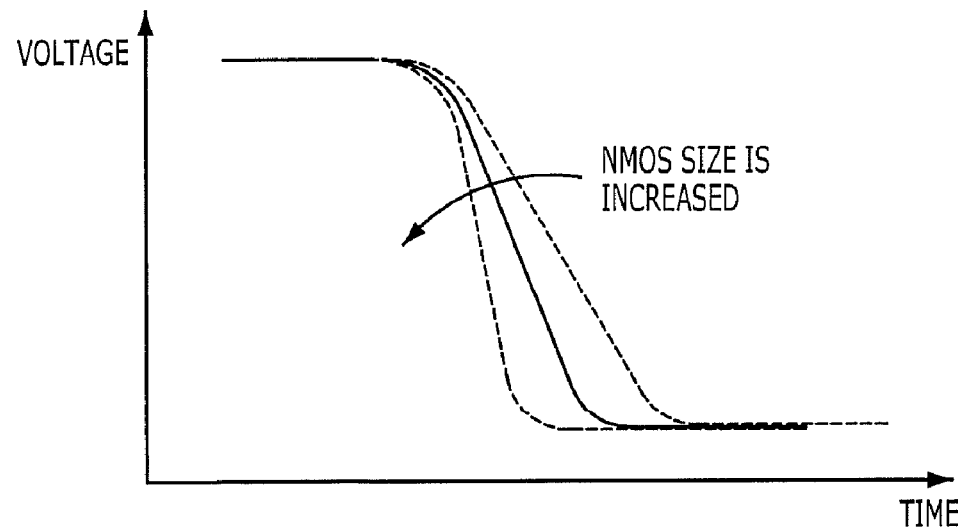
Figure 4:
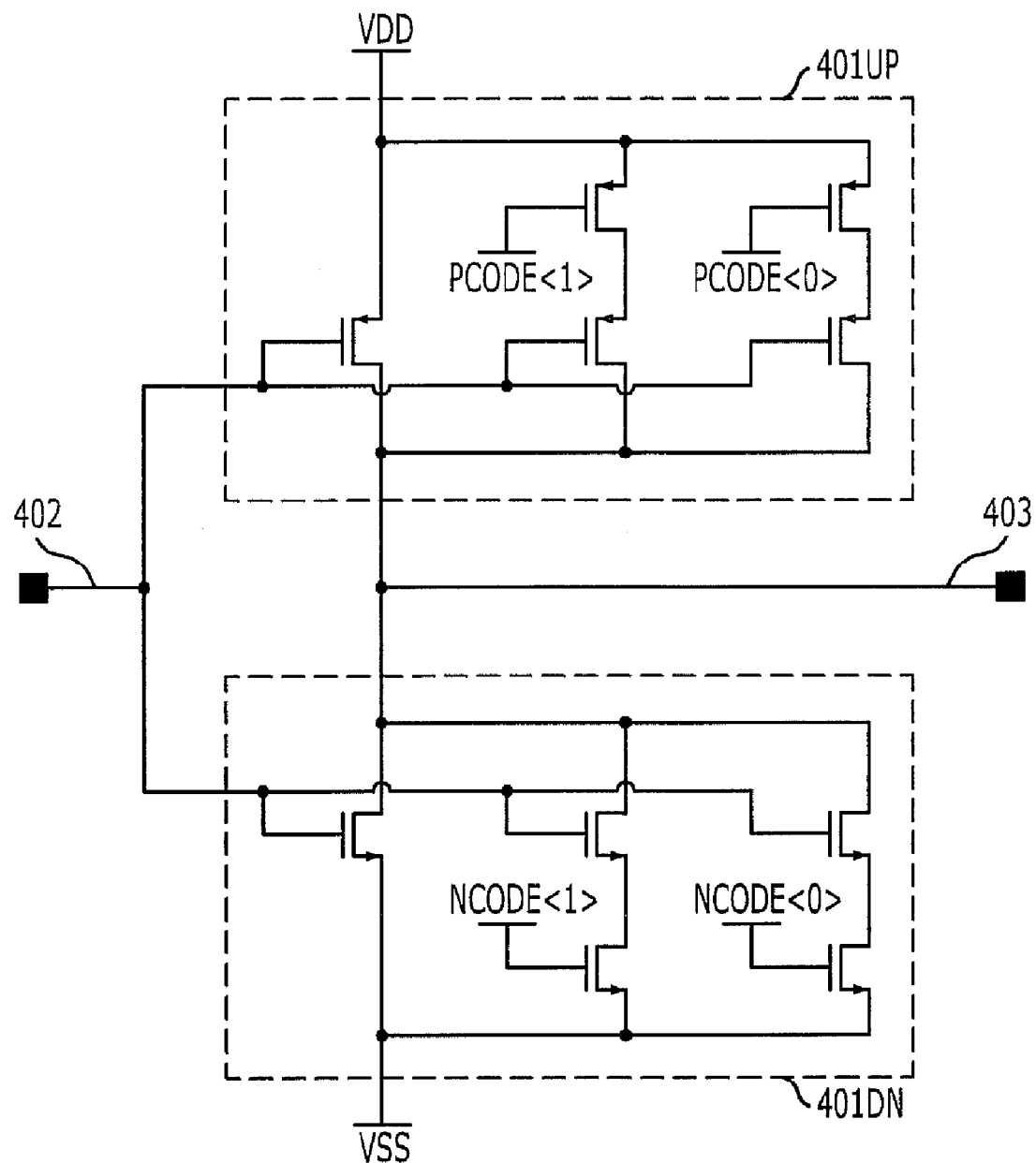
FIG. 4 is a structural diagram of an output driving device for controlling a slew rate.
Figure 8A:
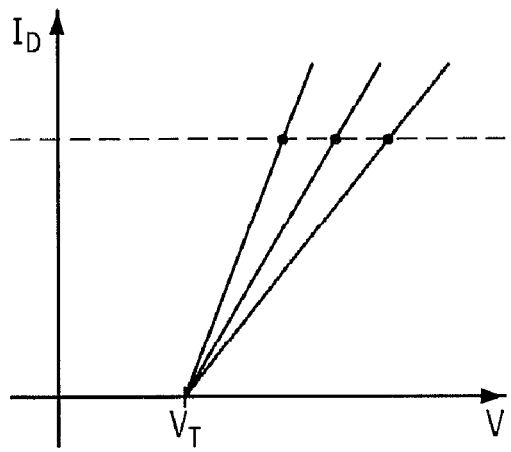
FIGS. 8A and 8B are graphs illustrating the comparison of the operations of the conventional output driving device of FIG. 4 and the output driving device of FIG. 5 in accordance with the embodiment of the present invention.
Figure 8B:
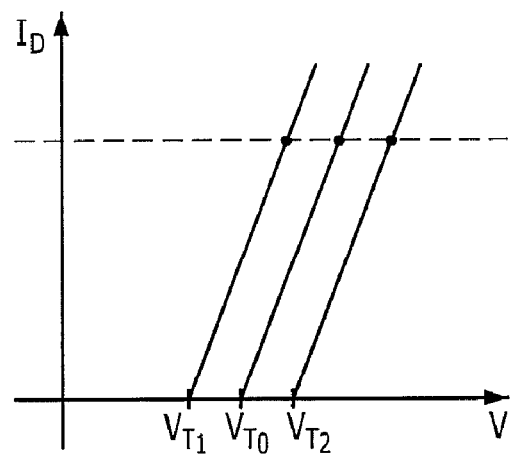

FIGS. 8A and 8B are graphs illustrating the comparison of the operations of the output driving device of FIG. 4 and the output driving device of FIG. 5 in accordance with the embodiment of the present invention.

Referring to FIGS. 8A and 8B, upon the operation of the conventional output driving device of FIG. 4, the amount of the currents of the MOS transistors, that is, the pull-up PMOS transistor and the pull-down NMOS transistor, is changed according to the increase of the voltage when the threshold voltages (VT) of the MOS transistors are in the fixed state.

On the other hand, upon the operation of the output driving device of FIG. 5 in accordance with the embodiment of the present invention, the threshold voltages (VT) of the MOS transistors, that is, the pull-up PMOS transistor and the pull-down NMOS transistor, are changed when the amount of the currents of the MOS transistors according to the increase of the voltage is in the fixed state.

In accordance with the embodiments of the present invention, when the slew rate needs to be increased, the body biases of the transistors used in the output driving device are controlled. That is, when the NMOS transistor is used as the driving element, the threshold voltage of the NMOS transistor is decreased if the body bias of the NMOS transistor is increased. In this case, it is possible to effectively increase the size of the NMOS transistor while increasing the current flowing through the NMOS transistor. Therefore, the operation of the output driving device can be controlled inefficiently, without excessive transistor driving power when controlling the slew rate.

While the present invention has been described with respect to the specific embodiments, it will be apparent to those skilled in the art that various changes and modifications may be made without departing from the spirit and scope of the invention as defined in the following claims.

In the above-described embodiments of the present invention, the structure for improving the slew rate is applied to a main driver of the output driving device. However, the present invention is not limited to those embodiments, but it is apparent that the above-described structure can be a sub driver provided at a front stage of the main driver.

What is claimed is:
1. An output driving device, comprising:
a push-pull type driving unit having a pull-up PMOS transistor and a pull-down NMOS transistor, wherein an intervening node between the pull-up PMOS transistor and the pull-down NMOS transistor is coupled to an output node, and body biases of the pull-up PMOS transistor and the pull-down NMOS transistor are configured to be controlled for control of a slew rate of an output signal at the output node; and a body controller including first and second body bias controllers, wherein the second body bias controller comprises:
  a division voltage generating unit configured to generate a division voltage by dividing a voltage between the output node and a ground voltage terminal at a ratio corresponding to a voltage level of a control signal: and
  a body bias supplying unit configured to supply the divided voltage as the body bias of the pull-down NMOS transistor.

2. The output driving device of claim 1, wherein the control of the slew rate is performed by the first body bias controller when the output signal changes from a low state to a high state.

3. The output driving device of claim 1, wherein the first body bias controller is configured to decrease the body bias of the pull-up PMOS transistor in increasing the slew rate, and increase the body bias of the pull-up PMOS transistor in decreasing the slew rate.

4. The output driving device of claim 3, wherein the first body bias controller comprises a resistor and a switch connected between a power supply voltage terminal and the output node so that a voltage determined according to an operation of the switch is supplied as the body bias of the pull-up PMOS transistor.

5. The output driving device of claim 1, wherein the first body bias controller comprises:
  a division voltage generating unit configured to generate a division voltage by dividing a voltage between a power supply voltage terminal and the output node at a ratio corresponding to a voltage level of a second control signal; and
  a body bias supplying unit configured to supply the divided voltage as the body bias of the pull-up PMOS transistor.

6. The output driving device of claim 5, wherein the first body bias controller is configured to control the voltage level of the second control signal in response to a multi-bit test code externally applied through a pad in a test mode operation.

7. The output driving device of claim 5, wherein the first body bias controller is configured to control the voltage level of the second control signal in response to a multi-bit voltage level control code defined in a mode register set (MRS) in a normal mode operation.

8. The output driving device of claim 1, wherein the control of the slew rate is configured to be performed by the second body bias controller when the output signal changes from a high state to a low state.

9. The output driving device of claim 8, wherein the second body bias controller is configured to increase the body bias of the pull-down NMOS transistor in increasing the slew rate, and decrease the body bias of the pull-down NMOS transistor decreasing the slew rate.

10. The output driving device of claim 9, wherein the second body bias controller comprises a resistor and a switch connected between the output node and the ground voltage terminal so that a voltage determined according to an operation of the switch is supplied as the body bias of the pull-down NMOS transistor.

11. The output driving device of claim 1, wherein the second body bias controller is configured to control the voltage level of the control signal in response to a multi-bit test code externally applied through a pad in a test mode operation.

12. The output driving device of claim 11, wherein the second body bias controller is configured to control the voltage level of the control signal in response to a multi-bit voltage level control code defined in a mode register set (MRS) in a normal mode operation.

13. The output driving device of claim 4, wherein the switch includes a MOS transistor.

14. A method for driving an output signal, the method comprising:
  driving the output signal at an output node with a push-pull type driving unit with a pull-up PMOS transistor and a pull-down NMOS transistor coupled to the output node; and
  controlling body bias voltages of the pull-up PMOS transistor and the pull-down NMOS transistor to adjust a slew rate of the output signal, wherein the control of the body biases includes:
    using a first voltage divider to divide a voltage between a power supply voltage terminal and the output node to provide the body bias voltage of the pull-up PMOS transistor, wherein the first voltage divider includes a first control transistor receiving a first control signal and a resistor that are connected in series; and
    using a second voltage divider to divide a voltage between the output node and a ground voltage terminal to provide the body bias voltage of the pull-down NMOS transistor, wherein the second voltage divider includes a second control transistor receiving a second control signal and a resistor that are connected in series.

15. The method of claim 14, wherein at least one of the first and second control signals is generated in response to a multi-bit test code externally applied through a pad in a test mode operation.

16. The method of claim 14, wherein at least one of the first and second control signals is generated in response to a multi-bit voltage level control code defined in a mode register set (MRS) in a normal mode operation.

17. An output driving device, comprising:
  a push-pull type driving unit having a pull-up PMOS transistor and a pull-down NMOS transistor. wherein an intervening node between the pull-up PMOS transistor and the pull-down NMOS transistor is coupled to an output node; and
  a body bias control unit configured to control a slew rate of an output signal at the output node by controlling body biases of the pull-up PMOS transistor and the pull-down NMOS transistor,
  wherein the body bias control unit includes first and second body bias controllers and the first body bias controller comprises:
    a division voltage generating unit configured to generate a division voltage by dividing a voltage between the power supply voltage terminal and the output node at a ratio corresponding to a voltage level of a control signal; and
    a body bias supplying unit configured to supply the divided voltage as the body bias of the pull-up PMOS transistor.

18. The output driving device of claim 17, wherein the first body bias controller is configured to control the body bias of the pull-up PMOS transistor when the output signal changes from a low state to a high state, and the second body bias controller is configured to control the body bias of the pull-down NMOS transistor when the output signal changes from a high state to a low state.

19. The output driving device of claim 18, wherein the first body bias controller is configured to decrease the body bias of the pull-up PMOS transistor in increasing the slew rate, and increase the body bias of the pull-up PMOS transistor in decreasing the slew rate.

20. The output driving device of claim 19, wherein the first body bias controller comprises a resistor and a switch connected between the power supply voltage terminal and the output node so that a voltage determined according to an operation of the switch is supplied as the body bias of the pull-up PMOS transistor.

21. The output driving device of claim 17, wherein the first body bias controller is configured to control the voltage level of the control signal in response to a multi-bit test code externally applied through a pad in a test mode operation.

22. The output driving device of claim 17, wherein the first body bias controller is configured to control the voltage level of the control signal in response to a multi-bit voltage level control code defined in a mode register set (MRS) in a normal mode operation.

23. The output driving device of claim 17, wherein the second body bias controller is configured to increase the body bias of the pull-down NMOS transistor in increasing the slew rate, and decrease the body bias of the pull-down NMOS transistor in decreasing the slew rate.

24. The output driving device of claim 23, wherein the second body bias controller comprises a resistor and a switch connected between the output node and a ground voltage terminal so that a voltage determined according to an operation of the switch is supplied as the body bias of the pull-down NMOS transistor.

25. The output driving device of claim 23, wherein the second body bias controller comprises:
   a division voltage generating unit configured to generate a division voltage by dividing a voltage between the output node and the ground voltage terminal at a ratio corresponding to a voltage level of a second control signal; and
   a body bias supplying unit configured to supply the divided voltage as the body bias of the pull-down NMOS transistor.

26. The output driving device of claim 25, wherein the second body bias controller is configured to control the voltage level of the second control signal in response to a multi-bit test code externally applied through a pad in a test mode operation.

27. The output driving device of claim 26, wherein the second body bias controller is configured to control the voltage level of the second control signal in response to a multi-bit voltage level control code defined in a mode register set (MRS) in a normal mode operation.

* * * * *